United States Patent
You

(10) Patent No.: US 9,263,679 B2
(45) Date of Patent: Feb. 16, 2016

(54) ORGANIC LIGHT EMITTING DISPLAY AND MANUFACTURING METHOD THEREOF

(71) Applicant: SAMSUNG DISPLAY CO., LTD., Yongin, Gyeonggi-Do (KR)

(72) Inventor: Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/463,915

(22) Filed: Aug. 20, 2014

(65) Prior Publication Data
US 2015/0171147 A1 Jun. 18, 2015

(30) Foreign Application Priority Data
Dec. 17, 2013 (KR) .......................... 10-2013-0157327

(51) Int. Cl.
| | |
|---|---|
| *H01L 29/08* | (2006.01) |
| *H01L 51/00* | (2006.01) |
| *H01L 29/786* | (2006.01) |
| *H01L 27/32* | (2006.01) |

(52) U.S. Cl.
CPC ........ *H01L 51/0035* (2013.01); *H01L 27/3262* (2013.01); *H01L 27/3265* (2013.01); *H01L 29/786* (2013.01); *H01L 51/0011* (2013.01); *H01L 2227/323* (2013.01)

(58) Field of Classification Search
CPC ..................... H01L 27/32665; H01L 27/3262; H01L 27/786
USPC .......................................................... 257/40
See application file for complete search history.

(56) References Cited

U.S. PATENT DOCUMENTS

| | | | |
|---|---|---|---|
| 2009/0201230 A1 | 8/2009 | Smith | |
| 2012/0080663 A1* | 4/2012 | Lee | ...................... H01L 27/3265 257/40 |
| 2012/0146031 A1* | 6/2012 | Lee | ...................... H01L 27/3265 257/59 |
| 2013/0001562 A1* | 1/2013 | Choi | ................... H01L 27/3265 257/59 |
| 2014/0346461 A1* | 11/2014 | Kim | ..................... H01L 27/1288 257/40 |

FOREIGN PATENT DOCUMENTS

| | | |
|---|---|---|
| JP | 2006-065320 | 3/2006 |
| KR | 10-2006-0032536 | 4/2006 |
| KR | 10-2007-0049743 | 5/2007 |
| KR | 10-2013-0053053 | 5/2013 |

\* cited by examiner

*Primary Examiner* — Douglas Menz
(74) *Attorney, Agent, or Firm* — Christie, Parker & Hale, LLP

(57) ABSTRACT

An organic light emitting display includes a base substrate, an active layer on the base substrate, a gate insulating layer on the active layer, a gate electrode on the gate insulating layer, a first inter-insulating layer on the gate electrode, a second inter-insulating layer covering the first inter-insulating layer, source and drain electrodes on the second inter-insulating layer and connected to the active layer, a first electrode connected to the drain electrode, an organic light emitting layer on the first electrode, a second electrode facing the first electrode while the organic light emitting layer is between the first and second electrodes, and first and second capacitor electrodes facing each other while the gate insulating layer is between the first and second capacitor electrodes. The second inter-insulating layer makes contact with an upper surface of the second capacitor electrode through an opening formed on the first inter-insulating layer.

20 Claims, 8 Drawing Sheets

ORGANIC LIGHT EMITTING DISPLAY AND MANUFACTURING METHOD THEREOF

CROSS-REFERENCE TO RELATED APPLICATION

This application claims priority to and the benefit of Korean Patent Application No. 10-2013-0157327, filed on Dec. 17, 2013, in the Korean Intellectual Property Office, the content of which is hereby incorporated by reference in its entirety.

BACKGROUND

1. Field

The present disclosure relates to an organic light emitting display and a method of manufacturing the same.

2. Description of the Related Art

Flat display devices are classified into light emitting flat display devices and light receiving flat display devices. As the light emitting flat display device, a flat cathode ray tube, a plasma display panel, and an electroluminescent device are widely used (utilized). As the light receiving flat display device, a liquid crystal display is used (utilized). Among them, the electroluminescent device has been spotlighted as a next generation display device since it has wide viewing angles, superior contrast ratio, and fast response speed. The electroluminescent device is classified into an inorganic electroluminescent device and an organic electroluminescent device according to a material used (utilized) to form a light emitting layer.

Among them, the organic electroluminescent device is a self-emissive display that electrically excites fluorescent organic compound to emit light. The organic electroluminescent device has been spotlighted as a next generation display device since it has low driving voltage, thin thickness, superior brightness, wide viewing angle, and fast response speed when compared to a liquid crystal display.

The organic electroluminescent device includes a light emitting layer formed of an organic material and disposed between an anode electrode and a cathode electrode. When a voltage is applied to the anode and cathode electrodes, holes injected from the anode electrode move to the light emitting layer through a hole transport layer and electrons injected from the cathode electrode move to the light emitting layer through an electron transport layer. The holes and electrons are recombined in the light emitting layer to generate excitons. The excitons, which are discharged when return from an excited state to a ground state, emit light.

SUMMARY

An aspect according to one or more embodiments of the present disclosure is directed toward an organic light emitting display having high image display quality.

Another aspect according to one or more embodiments of the present disclosure is directed toward a method of manufacturing the organic light emitting display.

According to one or more embodiments of the inventive concept, an organic light emitting display includes a base substrate, an active layer on the base substrate, a gate insulating layer on the active layer, a gate electrode on the gate insulating layer, a first inter-insulating layer on the gate electrode, a second inter-insulating layer covering the first inter-insulating layer, source and drain electrodes on the second inter-insulating layer and connected to the active layer, a first electrode connected to the drain electrode, an organic light emitting layer on the first electrode, a second electrode facing the first electrode with the organic light emitting layer between the first and second electrodes, and first and second capacitor electrodes facing each other with the gate insulating layer between the first and second capacitor electrodes. The second inter-insulating layer makes contact with an upper surface of the second capacitor electrode through an opening of the first inter-insulating layer.

The first inter-insulating layer includes an inorganic material, and the second inter-insulating layer includes an organic material. The opening of the first inter-insulating layer is filled with the organic material. The base substrate has a plurality of pixel areas, and an area of the opening corresponds to about 10% to about 50% of the total area of each of the pixel areas when viewed in a plan view.

The inorganic material includes silicon nitride, silicon oxide, and/or silicon oxynitride. The organic material includes an acryl-based polymer, an imide-based polymer, an arylether-based polymer, an amide-based polymer, a fluorine-based polymer, a vinylalcohol-based polymer, a phenol-based polymer, or a material obtained by blending the polymers (e.g., a mixture thereof).

The light emitting layer is configured to emit a light that travels toward the second electrode to be recognized by a user.

According to one or more embodiments of the inventive concept, a method of manufacturing an organic light emitting display includes forming an active layer on a base substrate, forming a first capacitor electrode on the base substrate, forming a gate insulating layer on the base substrate, forming a gate electrode and a second capacitor electrode on the gate insulating layer, forming a first inter-insulating layer on the gate insulating layer, the first inter-insulating layer having an opening through which an upper surface of the second capacitor electrode is exposed, forming a second inter-insulating layer on the first inter-insulating layer, forming source and drain electrodes on the second inter-insulating layer to be connected to the active layer, forming a first electrode connected to the drain electrode, forming a light emitting layer on the first electrode, and forming a second electrode on the light emitting layer.

According to the above, the organic light emitting display manufactured by the above-mentioned method may provide high image display quality.

BRIEF DESCRIPTION OF THE DRAWINGS

The above and other enhancements of the present disclosure will become readily apparent by reference to the following detailed description when considered in conjunction with the accompanying drawings, wherein.

DETAILED DESCRIPTION

Figure 1:
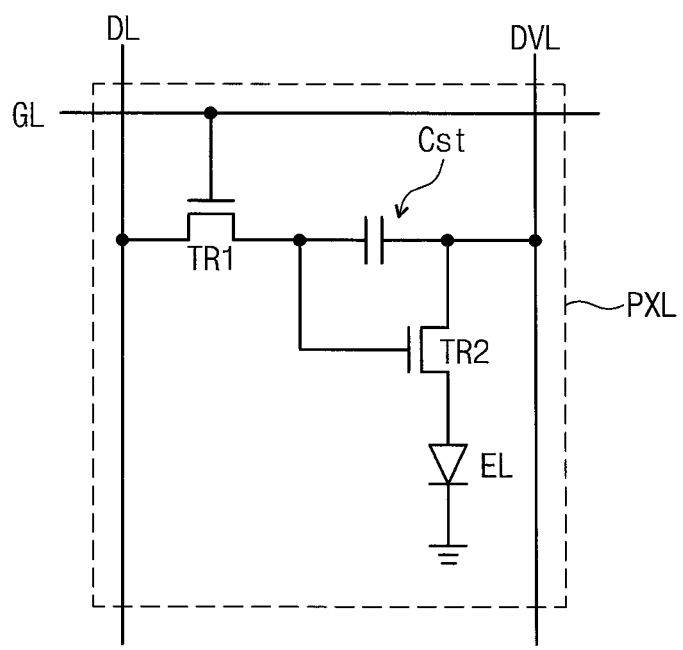
FIG. 1 is a circuit diagram showing an organic light emitting display according to an example embodiment of the present disclosure.

It will be understood that when an element or layer is referred to as being "on", "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like reference numbers refer to like elements throughout. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in more detail with reference to the accompanying drawings.

Figure 2:
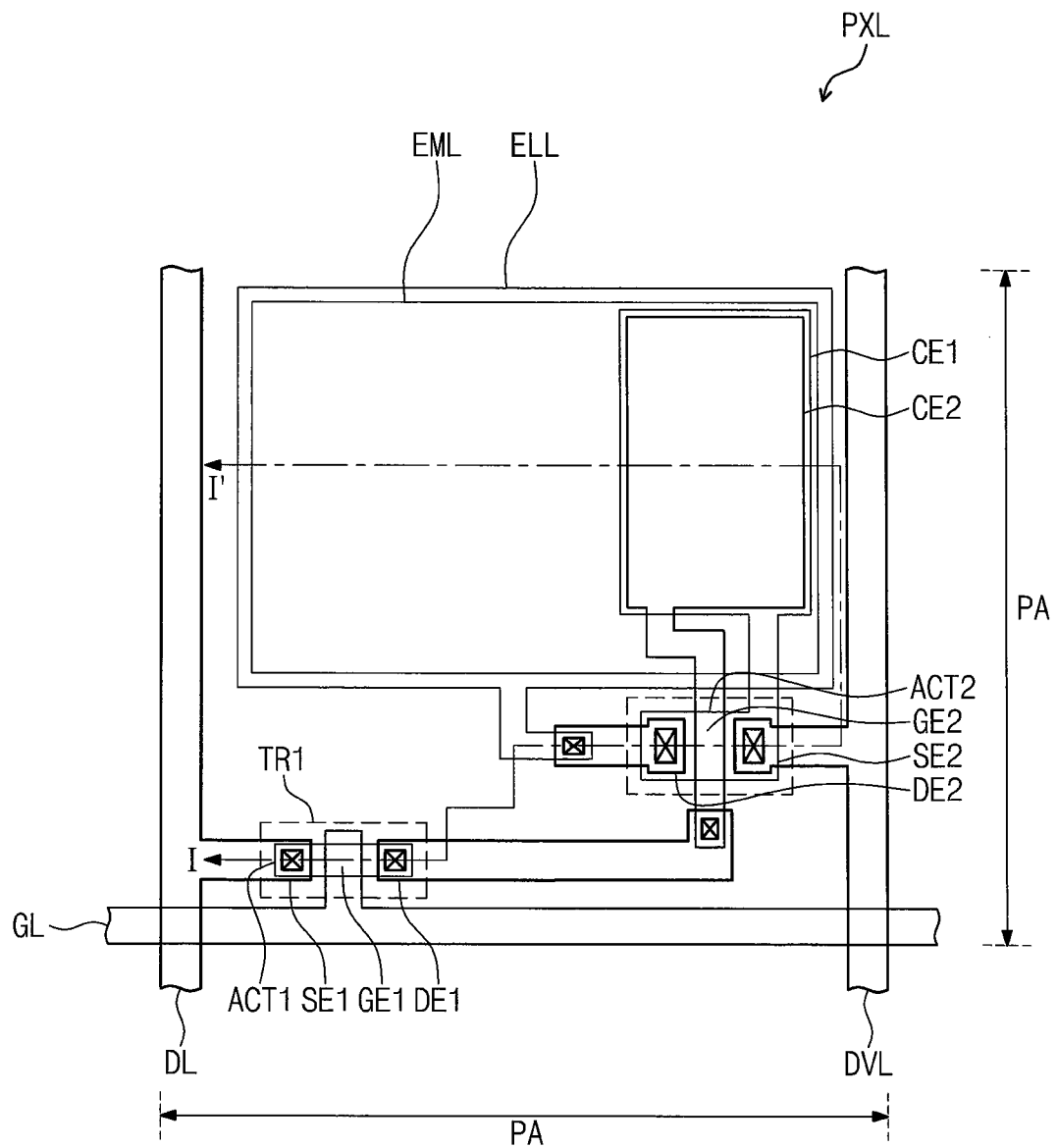
FIG. 2 is a plan view showing a pixel shown in FIG. 1.
Figure 3:
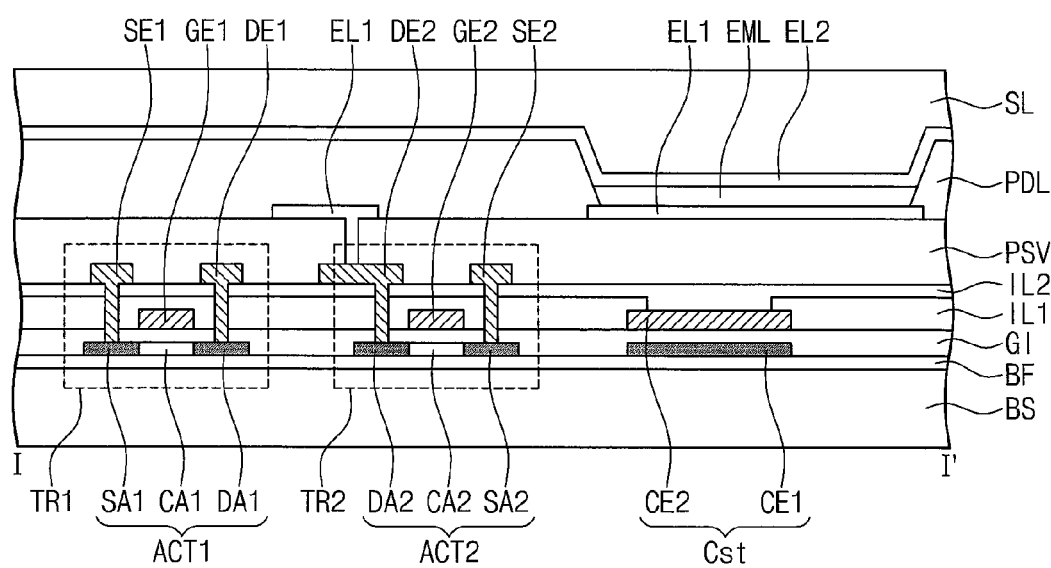
FIG. 3 is a cross-sectional view taken along the line I-I' shown in FIG. 2.

FIG. 1 is a circuit diagram showing an organic light emitting display according to an example embodiment of the present disclosure, FIG. 2 is a plan view showing a pixel shown in FIG. 1, and FIG. 3 is a cross-sectional view taken along the line I-I' shown in FIG. 2.

Hereinafter, the organic light emitting display according to the example embodiment of the present disclosure will be described in more detail with reference to FIGS. 1 to 3.

The organic light emitting display includes at least one pixel PXL to display an image. The pixel PXL is disposed in a pixel area PA. The pixel PXL may be provided in a plural number and the pixels PXL may be arranged in a matrix form. However, for the convenience of explanation, only one pixel PXL will be described in more detail in the following description. Here, each pixel PXL has a rectangular shape, but it should not be limited to the rectangular shape. In addition, the pixels PXL may have different areas from each other.

The pixel PXL includes a line part including a gate line GL, a data line DL, and a driving voltage line DVL; a thin film transistor connected to the line part; an organic light emitting device EL connected to the thin film transistor; and a capacitor Cst.

The gate line GL extends in one direction and the data line DL extends in another direction to cross the gate line GL. The driving voltage line DVL extends in the same direction as the data line DL.

The gate line GL applies a scan signal to the thin film transistor, the data line DL applies a data signal to the thin film transistor, and the driving voltage line applies a driving voltage to the thin film transistor.

The thin film transistor includes a driving thin film transistor TR2 to control the organic light emitting device EL and a switching thin film transistor TR1 to switch the driving thin film transistor TR2 on and off. In the present example embodiment, one pixel PXL includes two thin film transistors TR1 and TR2, but the number of thin film transistors should not be limited to two. That is, one pixel PXL may include one thin film transistor and one capacitor, or may include three or more thin film transistors and two or more capacitors.

The switching thin film transistor TR1 includes a first active layer ACT1, a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a gate electrode (i.e., a second gate electrode GE2) of the driving thin film transistor TR2. The first source electrode SE1 and the first drain electrode DE1 are connected to the first active layer ACT1.

The switching thin film transistor TR1 provides the data signal (applied to the data line DL) to the driving thin film transistor TR2 in response to the scan signal applied to the gate line GL.

The driving thin film transistor TR2 includes a second active layer ACT2, a second gate electrode GE2, a second source electrode SE2, and a second drain electrode DE2. The second gate electrode GE2 is connected to the switching thin film transistor TR1. The second source electrode SE2 is connected to the driving voltage line DVL, and the second drain electrode DE2 is connected to the organic light emitting device EL. The second source electrode SE2 and the second drain electrode DE2 are connected to the second active layer ACT2.

The organic light emitting device EL includes a light emitting layer EML, a first electrode EL1, and a second electrode EL2 facing the first electrode EL1 with the light emitting layer EML disposed between the first and second electrodes EL1 and EL2. The first electrode EL1 is connected to the second drain electrode DE2 of the driving thin film transistor TR2. The second electrode EL2 is applied with a common voltage, and the light emitting layer EML emits light in response to an output signal from the driving thin film transistor TR2, thereby displaying the image.

The capacitor Cst is connected between the second gate electrode GE2 and the second source electrode SE2 of the driving thin film transistor TR2. The capacitor Cst is charged with the data signal input for the second gate electrode GE2 of the driving thin film transistor TR2 and maintains the data signal.

Referring to FIGS. 2 and 3, the organic light emitting display includes a base substrate BS. The base substrate BS may be an insulating substrate made of glass, crystal, or organic polymer. As the organic polymer for the base substrate BS, polyethylene terephthalate (PET), polyethylene naphthalate (PEN), polyimide (PI), and/or polyether sulfone may be used.

A buffer layer BF is disposed on the base substrate BS. The buffer layer BF reduces or prevents foreign substances from entering the switching and driving thin film transistors TR1 and TR2. The buffer layer BF may include silicon nitride (SiNx), silicon oxide (SiOx), or silicon oxynitride (SiOxNy). The buffer layer BF may have a single- or multi-layer structure and may be omitted depending on a material and a process condition of the base substrate BS.

The first active layer ACT1, the second active layer ACT2, and a first capacitor electrode CE1 are disposed on the buffer layer BF. The first active layer ACT1 and the second active layer ACT2 each include a semiconductor material and act as active layers of the switching and driving thin film transistors TR1 and TR2, respectively. The first active layer ACT1 includes a first source area SA1, a first drain area DA1, and a first channel area CA1 disposed between the first source area SA1 and the first drain area DA1. The second active layer ACT2 includes a second source area SA2, a second drain area DA2, and a second channel area CA2 disposed between the second source area SA2 and the second drain area DA2.

Each of the first and second active layers ACT1 and ACT2 may be formed of an inorganic semiconductor or an organic semiconductor. For instance, the first and second active layers ACT1 and ACT2 may include an oxide semiconductor, an amorphous silicon semiconductor, a crystalline or polycrystalline silicon semiconductor, etc. The oxide semiconductor includes an oxide material having at least one of indium (In), gallium (Ga), zinc (Zn), tin (Sn), etc. For instance, first and second semiconductor layers SM1 and SM2 (for forming the first and second active layers ACT1 and ACT2) may include an oxide semiconductor, such as zinc oxide, tin oxide, indium oxide, indium-zinc oxide, indium-tin oxide, indium-gallium-zinc oxide, indium-zinc-tin oxide, indium-gallium-zinc-tin oxide, etc. The first and second source areas (SA1 and SA2) and the first and second drain areas (DA1 and DA2) may be doped with dopants, e.g., n-type dopant (n-dopant) or p-type dopant (p-dopant).

The first capacitor electrode CE1 corresponds to one of two electrodes included in the capacitor Cst. The first capacitor electrode CE1 covers a portion of each pixel area PA when viewed in a plan view. The first capacitor electrode CE1 has an area determined depending on a thickness and a dielectric constant of a gate insulating layer GI and an area of a second capacitor electrode CE2. In the present example embodiment, the first capacitor electrode CE1 covers the portion corresponding to about 10% to about 50% of each pixel area PA. The first capacitor electrode CE1 may be formed of the inorganic semiconductor or the organic semiconductor, similar to the first and second active layers ACT1 and ACT2. The first capacitor electrode CE1 is doped with the n-type dopant or the p-type dopant as the first and second source areas (SA1 and SA2) and the first and second drain areas (DA1 and DA2), and thus the first capacitor electrode CE1 has conductivity. For instance, the first capacitor electrode CE1 may include an oxide semiconductor, an amorphous silicon semiconductor, or a crystalline or polycrystalline silicon semiconductor, each of which is doped with the n-type or p-type dopant. The first capacitor electrode CE1 may be integrally formed (provided) with the second active layer ACT2 and connected to the driving voltage line DVL.

The gate insulating layer GI is disposed on the first active layer ACT1, the second active layer ACT2, and the first capacitor electrode CE1.

The first gate electrode GE1, the second gate electrode GE2, and the second capacitor electrode CE2 are disposed on the gate insulating layer GI. The first gate electrode GE1 is connected to the gate line GL. The second gate electrode GE2 is connected to the first drain electrode DE1. The first gate electrode GE1 covers the area corresponding to the first active layer ACT1 and the first channel area CA1, and the second gate electrode GE2 covers the area corresponding to the second active layer ACT2 and the second channel area CA2.

The second capacitor electrode CE2 is connected to the second gate electrode GE2. The second capacitor electrode CE2 is disposed to correspond to the area in which the first capacitor electrode CE1 is formed, and is overlapped with the first capacitor CE1 when viewed in a plan view. The second capacitor electrode CE2 has substantially the same shape and area as those of the first capacitor electrode CE1.

The first capacitor electrode CE1, the second capacitor electrode CE2, and the gate insulating layer GI disposed between the first and second capacitor electrodes CE1 and CE2 form the capacitor Cst.

The first and second gate electrodes GE1 and GE2 and the second capacitor electrode CE2 may have a single-layer or multi-layer structure of at least one metal material selected from aluminum (Al), platinum (Pt), palladium (Pd) silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and an alloy thereof.

A first inter-insulating layer IL1 is disposed on the gate insulating layer GI to cover the first and second gate electrodes GE1 and GE2.

The first inter-insulating layer IL1 may include an inorganic material. The first inter-insulating layer IL1 has an opening formed on an area where the second capacitor electrode CE is formed. The first inter-insulating layer IL1 includes at least one of silicon nitride, silicon oxide, or silicon oxynitride. The opening formed through the first inter-insulating layer IL1 corresponds to about 10% to about 50% of the area of each pixel area.

A second inter-insulating layer IL2 is disposed on the first inter-insulating layer IL1. The second inter-insulating layer IL2 covers the first inter-insulating layer IL1, and the opening formed through the first inter-insulating layer IL1 is filled with the second inter-insulating layer IL2. Accordingly, the second inter-insulating layer IL2 covers the second capacitor electrode CE2 and makes contacts with an upper surface of the second capacitor electrode CE2 through the opening of the first inter-insulating layer IL1.

The second inter-insulating layer IL2 includes an organic material. The second inter-insulating layer IL2 may include an acryl-based polymer, an imide-based polymer, an arylether-based polymer, an amide-based polymer, a fluorine-based polymer, a vinylalcohol-based polymer, a phenol-based polymer, etc. In addition, the second inter-insulating layer IL2 may include a material obtained by blending the above-mentioned polymers.

In the present example embodiment, the second inter-insulating layer IL2 has a dielectric constant smaller than that of the first inter-insulating layer IL1. In addition, the second inter-insulating layer IL2 has a thickness greater than that of the first inter-insulating layer IL1, even though the first inter-insulating layer IL1 is been drawn to have a thickness larger than that of the second inter-insulating layer IL2 in FIG. 3.

The first source electrode SE1, the first drain electrode DE1, the second source electrode SE2, the second drain electrode DE2, and the driving voltage line DVL are disposed on the second inter-insulating layer IL2.

The first source electrode SE1, the first drain electrode DE1, the second source electrode SE2, the second drain electrode DE2, and the driving voltage line DVL may have a single-layer or multi-layer structure of a metal material selected from aluminum (Al), platinum (Pt), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and an alloy thereof.

The first source electrode SE1 and the first drain electrode DE1 make contact with the first source area SA1 and the first drain area DA1 of the first active layer ACT1, respectively, through contact holes formed through the gate insulating layer GI and the first and second inter-insulating layers IL1 and IL2. The first drain electrode DE1 is connected to the second gate electrode GE2 through a contact hole formed through the first and second inter-insulating layer IL1 and IL2.

The second source electrode SE2 and the second drain electrode DE2 make contact with the second source area SA2 and the second drain area DA2 of the second active layer ACT2, respectively, through contact holes formed through the gate insulating layer GI, and the first and second inter-insulating layers IL1 and IL2. The second source electrode SE2 is branched from the driving voltage line DVL.

A passivation layer PSV is disposed on the first source electrode SE1, the first drain electrode DE1, the second source electrode SE2, the second drain electrode DE2, and the second inter-insulating layer IL2. The passivation layer PSV includes an organic or inorganic insulating material. For instance, the passivation layer PSV includes the inorganic material, such as silicon nitride or silicon oxide; or the organic material, such as an acryl-based polymer, an imide-based polymer, an arylether-based polymer, an amide-based polymer, a fluorine-based polymer, a vinylalcohol-based polymer, a phenol-based polymer, etc.

The passivation layer PSV may serve as a protective layer to protect the switching and driving thin film transistors TR1 and TR2, or as a planarization layer to planarize an upper portion of the base substrate BS on which the above-mentioned components are formed.

Although not shown in figures, a concavo-convex portion may be formed on an upper surface of the passivation layer PSV, if necessary.

A first electrode EL1 is disposed on the passivation layer PSV as an anode of the organic light emitting device EL. The first electrode EL1 is connected to the second drain electrode DE2 of the driving thin film transistor TR2 through a contact hole formed through the passivation layer PSV. The first electrode EL1 may be used (utilized) as the anode, but hereinafter, the first electrode EL1 will be described as a cathode.

The first electrode EL1 includes a conductive material having a low work function, e.g., metal, metal alloy, electrical conductive compound, or mixture thereof. As the conductive material having the low work function, lithium (Li), magnesium (Mg), aluminum (Al), aluminum-lithium (Al—Li), calcium (Ca), magnesium-indium (Mg—In), and magnesium-silver (Mg—Ag) may be used (utilized).

A pixel definition layer PDL is disposed on the base substrate BS, on which the first electrode EL1 is disposed, to partition areas in which the light emitting layer is formed corresponding to each pixel PXL. The pixel definition layer PDL exposes an upper surface of the first electrode EL1 and is protruded from the base substrate BS along a circumference of the pixel PLX.

The light emitting layer EML is disposed in the pixel area PA surrounded by the pixel definition layer PDL. The light emitting layer EML may emit white light. The light emitting layer EML may be formed of various light emitting materials each including a host and a dopant. As the dopant, a fluorescent dopant and/or a phosphorescent dopant may be used (utilized). As the host, for example, tris-(8-hydroxyquinoline)aluminum (Alq3), 4,4'-N,N'-dicarbazole-biphenyl (CBP), 9,10-di(naphthalen-2-yl)anthracene (ADN), or distyrylarylene (DSA) may be used (utilized), however, it should not be limited thereto or thereby. In addition, the light emitting layer EML may emit various colored lights.

The color of the light emitted from the light emitting layer EML should not be limited thereto or thereby. The light emitting layer EML may include light emitting materials to emit red, green, and blue colors corresponding to the pixels, respectively. Further, the light emitting layer EML may further emit yellow or magenta light, or one pixel may emit the white light.

A second electrode EL2 is disposed on the light emitting layer EML. The second electrode EL2 includes a material having a high work function and is formed of a transparent conductive layer, e.g., indium tin oxide (ITO), indium zinc oxide (IZO), zinc oxide (ZnO), indium tin zinc oxide (ITZO), etc. In the present example embodiment, only the light emitting layer EML is disposed between the first electrode EL1 and the second electrode EL2, but various layers may be further disposed between the first and second electrodes EL1 and EL2. In more detail, an electron injection layer and/or an electron transport layer may be disposed between the first electrode EL1 and the light emitting layer EML, and a hole injection layer and a hole transport layer may be disposed between the second electrode EL2 and the light emitting layer EML.

In addition, although not shown in the figures, an auxiliary line may be further provided to apply a common voltage to the second electrode EL2. The auxiliary line reduces or prevents a voltage drop of the second electrode EL2.

A sealing layer SL is disposed on the second electrode EL2 to cover the second electrode EL2.

According to the organic light emitting display having the above-mentioned structure, the first and second inter-insulating layers IL1 and IL2 are disposed on the gate line GL, the first and second gate electrodes GE1 and GE2, and the second capacitor electrode CE2; and the data line DL, the first and second source electrodes SE1 and SE2, and the first and second drain electrodes DE1 and DE2 are disposed on the second inter-insulating layer IL2, thereby reducing a parasitic capacitance generating in the first and second inter-insulating layers IL1 and IL2.

In a comparable organic light emitting display, an inorganic insulating material is used (utilized) to form the inter-insulating layer. The inorganic insulating material has a large dielectric constant and is difficult to be formed with thick thickness by using (utilizing) a deposition method. As a result, when the inter-insulating layer is formed of the inorganic insulating material, conductive components included in the comparable organic light emitting display are required to be spaced apart from each other by a set or predetermined distance in order to reduce or minimize a coupling effect caused by the parasitic capacitance. Consequently, an aperture ratio of the comparable organic light emitting display is reduced.

In comparison, according to the organic light emitting display of the present disclosure, the parasitic capacitance is generated between the conductive components respectively disposed at upper and lower portions of the first and second inter-insulating layers IL1 and IL2. Since the second inter-insulating layer IL2 has a relatively small dielectric constant and a relatively thick thickness when compared to those of the first inter-insulating layer IL1, the parasitic capacitance between the gate line GL, the data line DL, and the driving voltage line DVL and adjacent conductive components, e.g., the gate electrode, the first capacitor electrode, the second capacitor electrode, etc., is reduced, and the distance between the components included in the organic light emitting display is reduced. In addition, a signal delay in the gate line GL, the data line DL, and the driving voltage line DVL, which is caused by the parasitic capacitance, may be reduced or prevented.

Hereinafter, a method of manufacturing the organic light emitting display according to the present example embodiment of the present disclosure will be described in more detail with reference to FIGS. 4A to 4J.

Figure 4A:
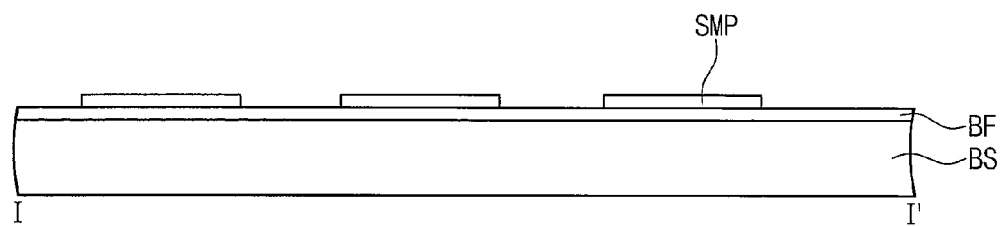
FIGS. 4A to 4J are cross-sectional views showing a method of manufacturing an organic light emitting display according to an example embodiment of the present disclosure.

Referring to FIG. 4A, a buffer layer BF is formed on the base substrate BS, and a semiconductor pattern SMP is formed on the buffer layer BF.

The buffer layer BF includes silicon nitride, silicon oxide, or silicon oxynitride and is formed on the entire surface of the base substrate BS. The buffer layer BF may be omitted according to the material used (utilized) to form the base substrate BS and the process condition for the base substrate BS.

The semiconductor pattern SMP is formed to correspond to the first active layer ACT1, the second active layer ACT2, and the first capacitor electrode CE1. The semiconductor pattern SMP is formed by depositing a semiconductor material and performing a photolithography process on the semiconductor material using (utilizing) a first mask. The semiconductor material may be amorphous silicon semiconductor, crystalline silicon semiconductor, or polycrystalline silicon semiconductor, or may include the oxide material including at least one of indium (In), gallium (Ga), zinc (Zn), and tin (Sn).

Figure 4B:
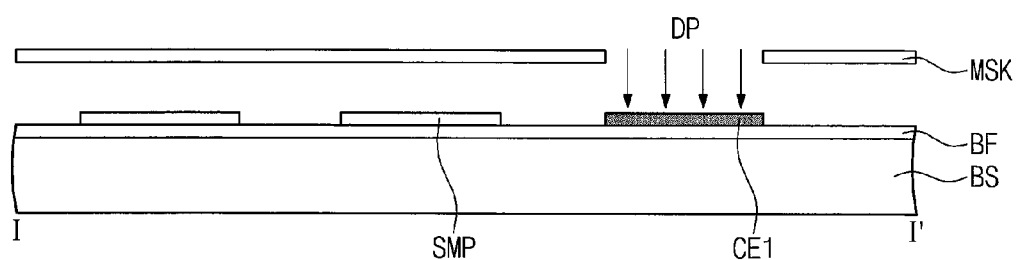

Referring to FIG. 4B, a portion of the semiconductor pattern SMP is doped with ion impurities, i.e., dopants DP, to form the first capacitor electrode CE1. The first capacitor electrode CE1 is formed by disposing a second mask MSK above the base substrate BS and implanting (adding) the dopants DP into the exposed portion of the semiconductor pattern SMP. The second mask MSK exposes the portion of the semiconductor pattern SMP which corresponds to the first capacitor electrode CE1, and covers the portions of the semiconductor pattern SMP which correspond to the first and second active layers ACT1 and ACT2.

The dopants DP may be implanted at a concentration sufficient to allow the semiconductor pattern SMP to have the suitable electrical conductivity. In the present example embodiment, the portions of the semiconductor pattern SMP, which correspond to the first and second active layers ACT1 and ACT2, are not doped, but if necessary, the portions of the semiconductor pattern SMP may be doped with the dopant at a low concentration without using (utilizing) the second mask MSK.

Figure 4C:
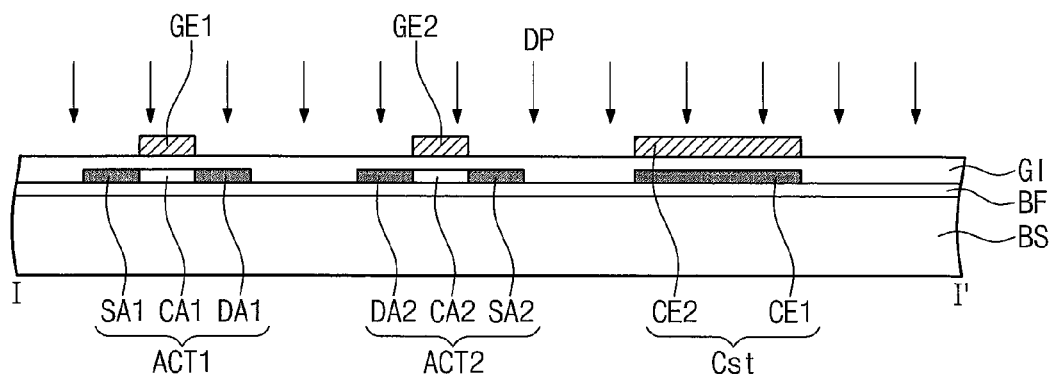

Referring to FIG. 4C, the gate insulating layer GI and a gate line part are formed on the base substrate BS on which the first capacitor electrode CE1 is formed.

The gate insulating layer GI covers the base substrate BS.

The gate line part includes the gate line GL, the first and second gate electrodes GE1 and GE2, and the second capacitor electrode CE2. The gate line GL and the first gate electrode GE1 may be integrally formed with each other, and the second gate electrode GE2 and the second capacitor electrode CE2 may be integrally formed with each other.

The gate line part is formed by using (utilizing) a photolithography process with a third mask. That is, the gate line part is formed by forming a first conductive layer on the gate insulating layer GI and patterning the first conductive layer.

The first conductive layer may have a single-layer or multi-layer structure of at least one metal material selected from aluminum (Al), platinum (Pt), palladium (Pd) silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and an alloy thereof.

After the gate line part is formed, the dopants DP are implanted into the semiconductor pattern SMP, and thus the first active layer ACT1 and the second active layer ACT2 are formed.

The first and second gate electrodes GE1 and GE2 serve as a mask during the implanting process, and areas of the semiconductor pattern SMP, which correspond to the areas in which the first and second gate electrodes GE1 and GE2 are formed, are not doped with the dopants DP. As a result, the first active layer ACT1 including the first source area SA1 and the first drain area DA1, which are doped with the dopants DP at a high concentration, and the first channel area CA1 not doped or doped with the dopants DP at a low concentration, is formed. In addition, the second active layer ACT2 including the second source area SA2 and the second drain area DA2, which are doped with the dopants DP at a high concentration, and the second channel area CA2 not doped or doped with the dopants DP at a low concentration, is formed.

Figure 4D:
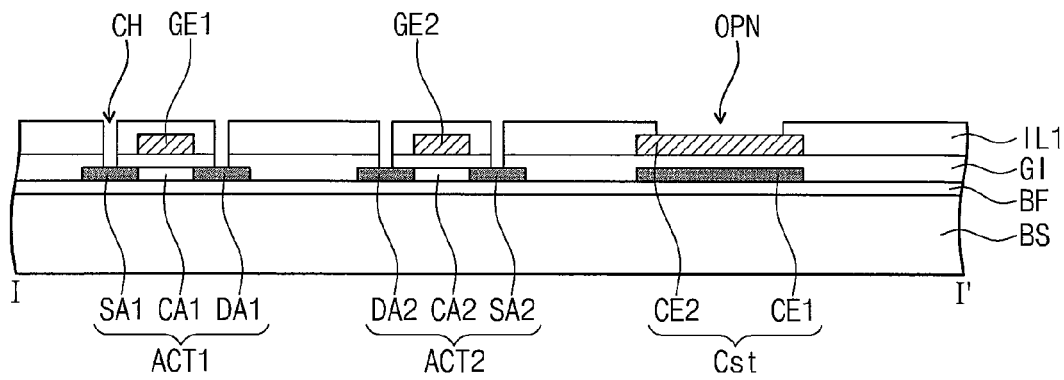

Referring to FIG. 4D, the first inter-insulating layer IL1 is formed on the base substrate BS on which the first and second active layers ACT1 and ACT2 and the second capacitor electrode CE2 are formed. The first inter-insulating layer IL1 is formed by a photolithography process using (utilizing) a fourth mask. The first inter-insulating layer IL1 is formed by forming an inorganic insulating layer on the base substrate BS and patterning the inorganic insulating layer. The inorganic insulating layer is patterned by a dry etching process, and in this case, inductive coupled plasma (ICP) or enhanced capacitive coupled plasma (ECCP) may be used (utilized) as the plasma.

In an embodiment, the first inter-insulating layer IL1 includes the opening OPN (to expose the upper surface of the second capacitor electrode CE2) and the contact holes (to expose portions of the first and second active layers ACT1 and ACT2). In one pixel area, the area, of (including) the opening OPN (through which the upper surface of the second capacitor electrode CE2 is exposed) and the contact holes CH (through which the portions of the first and second active layers ACT1 and ACT2 are exposed), corresponds to about 10% to about 50% of the total area of the one pixel area.

In a comparable top emission display device, the contact holes to expose the first and second active layers are provided, but the opening to expose the upper surface of the second capacitor electrode is not provided. Even when the opening to expose the upper surface of the second capacitor electrode is provided, the size of the opening is very small. Thus, a portion of the inter-insulating layer, which is etched away while the inter-insulating layer is patterned, corresponds to about 1% of the total area of one pixel area in the comparable top emission display device. As described above, since the etching area of the inter-insulating layer is much smaller than that of the pixel area in the comparable top emission display device, the inter-insulating layer may be over-etched or not etched. According to the organic light emitting display of the present disclosure, however, since the opening OPN to expose the second capacitor electrode CE2 is formed in addition to the contact holes CH to expose the portions of the first and second active layers ACT1 and ACT2, the portion of the first inter-insulating layer IL1, which corresponds to about 10% to about 50% of the total area of the one pixel area, is etched away. Accordingly, the etching process performed on the first inter-insulating layer IL1 may be easily controlled and may reduce or prevent the first inter-insulating layer IL1 from being over-etched or not etched.

Figure 4E:
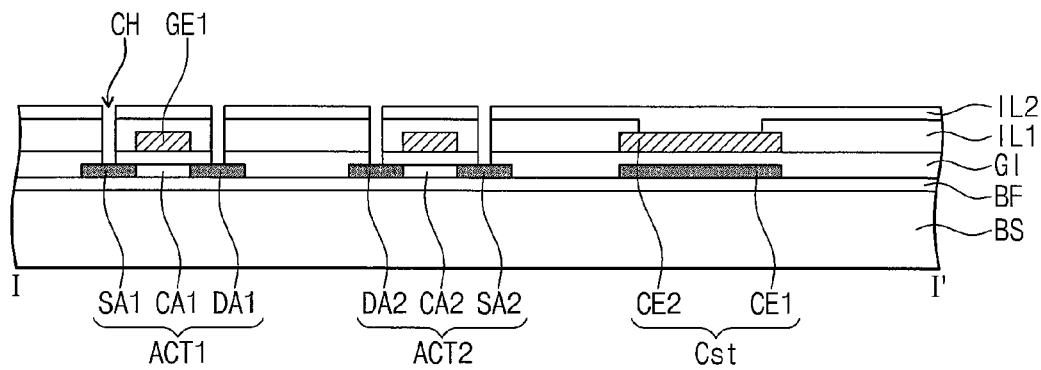

Referring to FIG. 4E, the second inter-insulating layer IL2 is formed on the first inter-insulating layer IL1. The second inter-insulating layer IL2 is formed by photolithography using (utilizing) a fifth mask. That is, the second inter-insulating layer IL2 is formed by forming an organic insulating layer on the base substrate BS on which the first inter-insulating layer IL1 is formed, and then patterning the organic insulating layer to expose the portions of the first and second active layers ACT1 and ACT2.

The patterned second inter-insulating layer IL2 includes the contact holes CH through which the portions of the first and second active layers ACT1 and ACT2 are exposed. The contact holes CH of the second inter-insulating layer IL2 overlap with the contact holes CH of the first inter-insulating layer IL1 when viewed in a plan view.

Figure 4F:
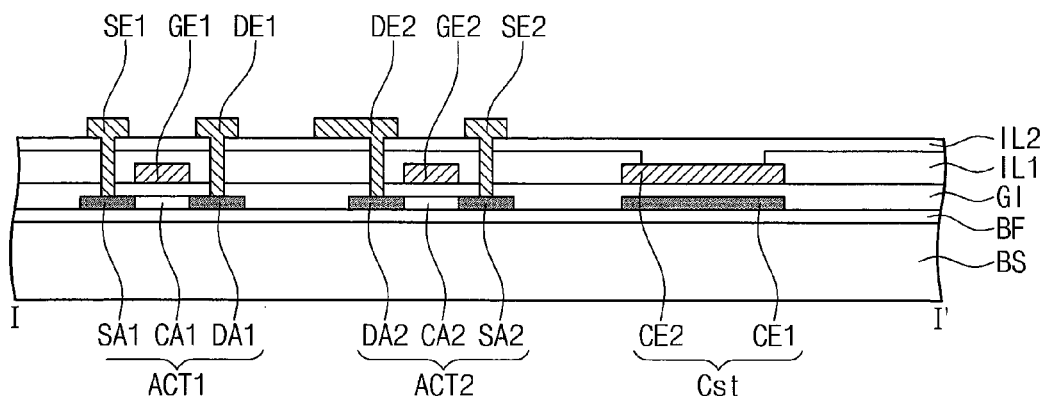

Referring to FIG. 4F, a data line part is formed on the base substrate BS on which the second inter-insulating layer IL2 is formed.

The data line part includes the data line DL, the first source electrode SE1, the first drain electrode DE1, the second source electrode SE2, the second drain electrode DE2, and the driving voltage line DVL. The data line DL and the first source electrode SE1 may be integrally formed with each other, and the driving voltage line DVL and the second source electrode SE2 may be integrally formed with each other. The first source electrode SE1, the first drain electrode DE1, the second source electrode SE2, and the second drain electrode DE2 are connected to the first source area SA1, the first drain area DA1, the second source area SA2, and the second drain area DA2, respectively, through the contact holes CH.

The data line part may be formed by a photolithography process using (utilizing) a sixth mask. That is, the data line part is formed by forming a second conductive layer on the gate insulating layer GI through a deposition process and patterning the second conductive layer. The second conductive layer includes the same metal material as or different metal material from that of the first conductive material. For instance, the second conductive layer may have a single-layer or multi-layer structure of at least one metal material selected from aluminum (Al), platinum (Pt), palladium (Pd) silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and an alloy thereof.

Figure 4G:
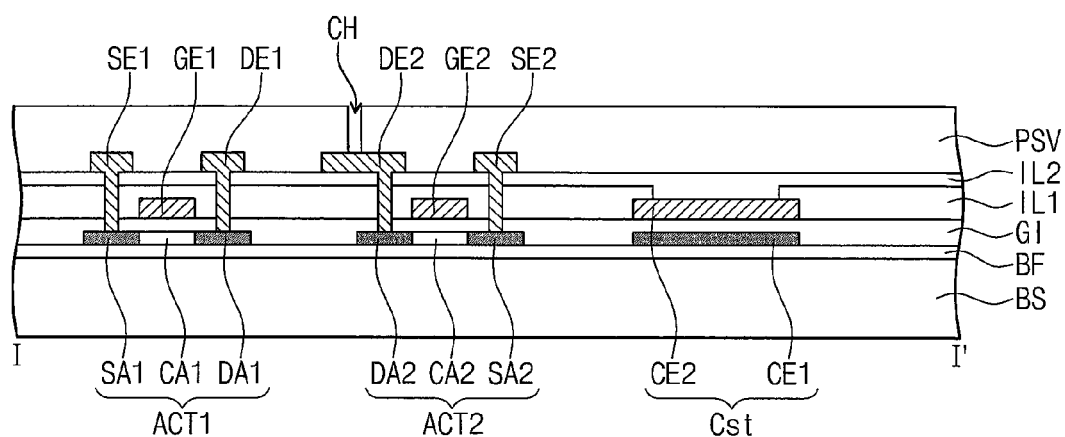

Referring to FIG. 4G, the passivation layer PSV is formed on the base substrate BS on which the data line part is formed.

The passivation layer PSV is formed by a photolithography process using (utilizing) a seventh mask. That is, the passivation layer PSV is formed by forming an insulating layer on the base substrate BS and patterning the insulating layer to expose a portion of the second drain electrode DE2. The patterned passivation layer PSV includes the contact hole CH through which the second drain electrode DE2 is exposed.

Although not shown in figures, the concavo-convex portion may be formed on the passivation layer PSV, if necessary. The concavo-convex portion may be formed by performing an additional photolithography process.

Figure 4H:
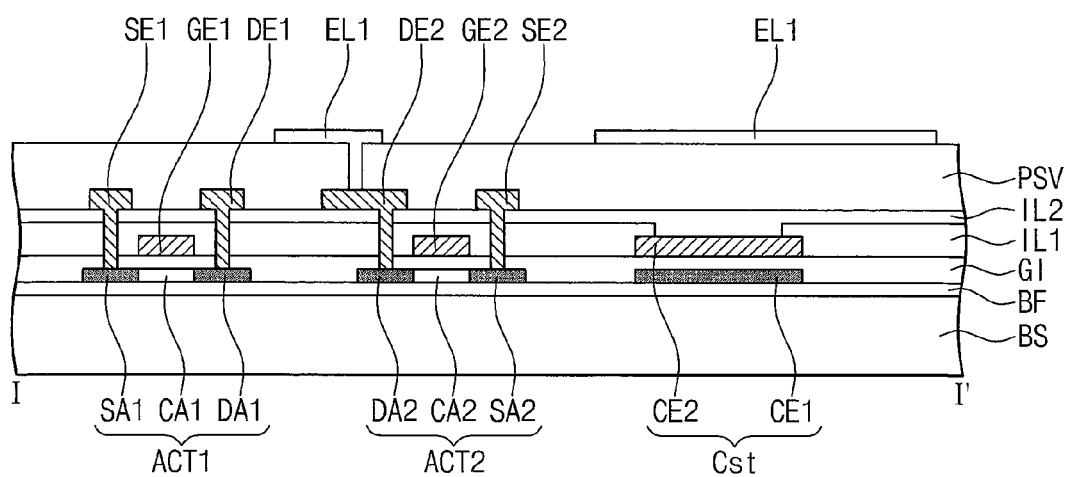

Referring to FIG. 4H, the first electrode EL1 is formed on the passivation layer PSV.

The first electrode EL1 is formed by a photolithography process using (utilizing) an eighth mask. That is, the first electrode EU is formed by forming a conductive layer on the base substrate BS and patterning the conductive layer. The first electrode EL1 is formed to cover the pixel area when viewed in a plan view.

Figure 4I:
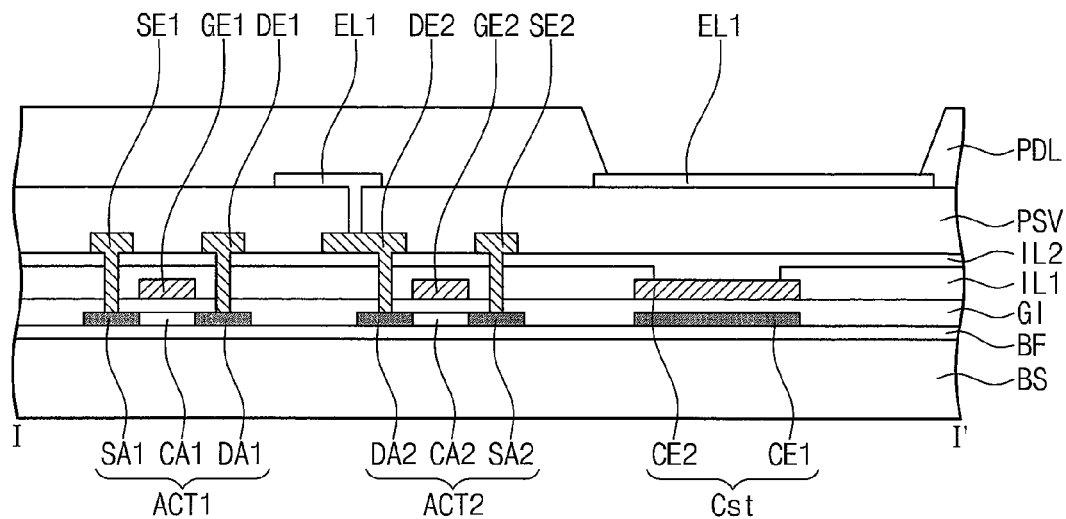

Referring to FIG. 4I, the pixel definition layer PDL is formed on the passivation layer PSV on which the first electrode EL1 is formed.

The pixel definition layer PDL is formed by a photolithography process using (utilizing) a ninth mask. The pixel definition layer PDL exposes the upper surface of the first electrode EL1 and is protruded from the base substrate BS along the circumference of the pixel. The pixel definition layer PDL partitions the areas in each of which the light emitting layer EML is formed.

Figure 4J:
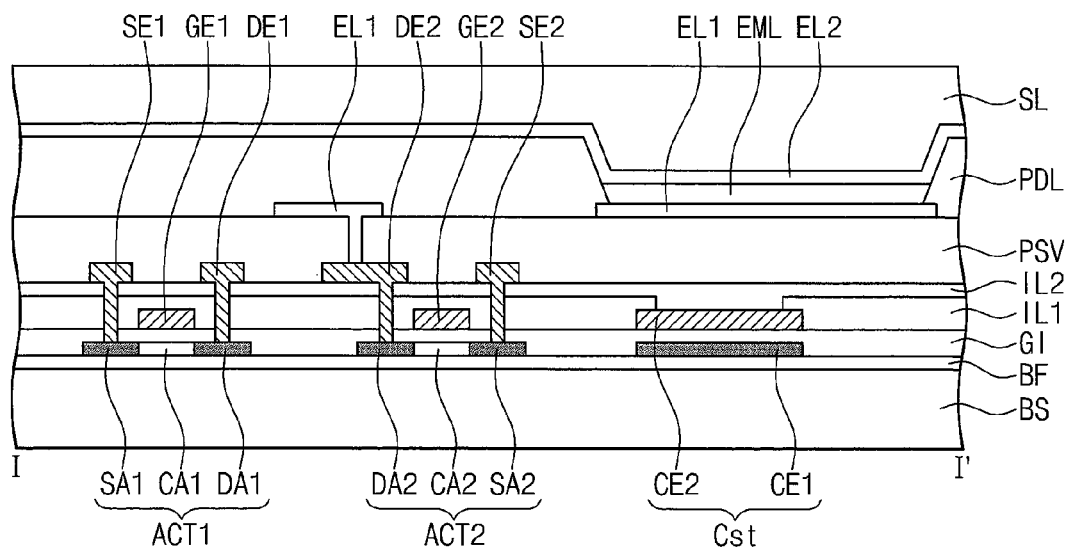

Referring to FIG. 4J, the light emitting layer EML is formed in the area partitioned by the pixel definition layer PDL, and the second electrode EL2 is formed on the pixel definition layer PDL and the light emitting layer EML.

The sealing layer SL is formed on the second electrode EL2.

The organic light emitting display manufactured by the above-mentioned method acts as the display device and the light emitted from the light emitting layer travels toward a user's eyes. That is, the organic light emitting display serves as a top emission display device.

Although the example embodiments of the present invention have been described, it is understood that the present invention should not be limited to these example embodiments but various changes and modifications can be made by one with ordinary skill in the art within the spirit and scope of the present invention as hereinafter claimed, and equivalents thereof.

What is claimed is:

1. An organic light emitting display comprising:
    a base substrate;
    an active layer on the base substrate;
    a gate insulating layer on the active layer;
    a gate electrode on the gate insulating layer;
    a first inter-insulating layer on the gate electrode;
    a second inter-insulating layer covering the first inter-insulating layer;
    source and drain electrodes on the second inter-insulating layer and connected to the active layer;
    a first electrode connected to the drain electrode;
    an organic light emitting layer on the first electrode;
    a second electrode facing the first electrode with the organic light emitting layer between the first and second electrodes; and
    first and second capacitor electrodes facing each other while the gate insulating layer is between the first and second capacitor electrodes,
    wherein the second inter-insulating layer makes contact with an upper surface of the second capacitor electrode through an opening of the first inter-insulating layer.

2. The organic light emitting display of claim 1, wherein the first inter-insulating layer comprises an inorganic material, and the second inter-insulating layer comprises an organic material.

3. The organic light emitting display of claim 2, wherein the opening of the first inter-insulating layer is filled with the organic material.

4. The organic light emitting display of claim 2, wherein the base substrate has a plurality of pixel areas, and an area of the opening corresponds to about 10% to about 50% of the total area of each of the pixel areas when viewed in a plan view.

5. The organic light emitting display of claim 2, wherein the inorganic material comprises silicon nitride, silicon oxide, and/or silicon oxynitride.

6. The organic light emitting display of claim 5, wherein the organic material comprises an acryl-based polymer, an imide-based polymer, an arylether-based polymer, an amide-based polymer, a fluorine-based polymer, a vinylalcohol-based polymer, a phenol-based polymer, and/or a material obtained by blending the polymers.

7. The organic light emitting display of claim 1, wherein the first capacitor electrode comprises a semiconductor doped with a dopant.

8. The organic light emitting display of claim 1, wherein the gate electrode and the second capacitor electrode comprise a same material.

9. The organic light emitting display of claim 1, further comprising:
   a gate line connected to the gate electrode and extending in a first direction; and
   a data line connected to the source electrode and extending in a second direction crossing the first direction.

10. The organic light emitting display of claim 1, wherein the light emitting layer is configured to emit a light that travels toward the second electrode to be recognized by a user.

11. A thin film transistor substrate comprising:
    a base substrate;
    an active layer on the base substrate;
    a gate insulating layer on the active layer;
    a gate electrode on the gate insulating layer;
    a first inter-insulating layer on the gate electrode;
    a second inter-insulating layer covering the first inter-insulating layer;
    source and drain electrodes on the second inter-insulating layer and connected to the active layer; and
    first and second capacitor electrodes facing each other with the gate insulating layer between the first and second capacitor electrodes,
    wherein the second inter-insulating layer makes contact with an upper surface of the second capacitor electrode through an opening of the first inter-insulating layer.

12. The thin film transistor substrate of claim 11, wherein the first inter-insulating layer comprises an inorganic material, and the second inter-insulating layer comprises an organic material.

13. A method of manufacturing an organic light emitting display, the method comprising:
    forming an active layer on a base substrate;
    forming a first capacitor electrode on the base substrate;
    forming a gate insulating layer on the base substrate;
    forming a gate electrode and a second capacitor electrode on the gate insulating layer;
    forming a first inter-insulating layer on the gate insulating layer, the first inter-insulating layer having an opening through which an upper surface of the second capacitor electrode is exposed;
    forming a second inter-insulating layer on the first inter-insulating layer;
    forming source and drain electrodes on the second inter-insulating layer to be connected to the active layer;
    forming a first electrode connected to the drain electrode;
    forming a light emitting layer on the first electrode; and
    forming a second electrode on the light emitting layer.

14. The method of claim 13, wherein the first inter-insulating layer comprises an inorganic material, and the second inter-insulating layer comprises an organic material.

15. The method of claim 14, wherein the opening of the first inter-insulating layer is filled with the organic material.

16. The method of claim 14, wherein the inorganic material comprises silicon nitride, silicon oxide, and/or silicon oxynitride.

17. The method of claim 16, wherein the organic material comprises an acryl-based polymer, an imide-based polymer, an arylether-based polymer, an amide-based polymer, a fluorine-based polymer, a vinylalcohol-based polymer, a phenol-based polymer, or a material obtained by blending the polymers.

18. The method of claim 13, wherein the active layer and the first capacitor electrode comprise a semiconductor doped with a dopant.

19. The method of claim 13, wherein the gate electrode and the second capacitor electrode comprise a metal material.

20. An organic light emitting display comprising:
    a base substrate;
    a thin film transistor on the base substrate;
    a capacitor on the base substrate; and
    an organic light emitting device connected to the thin film transistor and the capacitor, the thin film transistor comprising:
    an active layer on the base substrate;
    a gate insulating layer on the active layer;
    a gate electrode on the gate insulating layer;
    a first inter-insulating layer on the gate electrode;
    a second inter-insulating layer covering the first inter-insulating layer; and
    source and drain electrodes on the second inter-insulating layer and connected to the active layer,
    wherein the capacitor comprises first and second capacitor electrodes facing each other with the gate insulating layer between the first and second capacitor electrodes, and the first inter-insulating layer has an opening formed therethrough to expose an upper surface of the second capacitor electrode.

* * * * *